(12) United States Patent
Buitron et al.

(10) Patent No.: US 7,628,895 B2
(45) Date of Patent: *Dec. 8, 2009

(54) W-PATTERNED TOOLS FOR TRANSPORTING/HANDLING PAIRS OF DISKS

(75) Inventors: Gerardo Buitron, San Jose, CA (US); John Grow, Gilroy, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 674 days.

This patent is subject to a terminal disclaimer.

(21) Appl. No.: 10/435,161

(22) Filed: May 9, 2003

(65) Prior Publication Data
US 2003/0209421 A1 Nov. 13, 2003

Related U.S. Application Data

(60) Provisional application No. 60/379,008, filed on May 9, 2002.

(51) Int. Cl.
*C23C 14/34* (2006.01)
*H01L 21/677* (2006.01)

(52) U.S. Cl. .............. 204/192.2; 204/192.12; 204/192.16; 414/217; 414/222.01; 414/222.07; 414/222.08; 414/222.13; 414/225.01

(58) Field of Classification Search ............ 204/298.25, 204/298.15, 192.12, 192.2, 192.16; 414/217, 414/222.01, 222.07, 222.08, 222.13, 225.01
See application file for complete search history.

(56) References Cited

U.S. PATENT DOCUMENTS

| | | | |
|---|---|---|---|
| 3,382,647 A | 5/1968 | Davey et al. | |
| 3,505,777 A | 4/1970 | Tsutsumi | 53/168 |
| 4,573,851 A | 3/1986 | Butler | 414/404 |
| 4,669,612 A | 6/1987 | Mortensen | 206/454 |
| 4,676,008 A | 6/1987 | Armstrong | 34/237 |
| 4,694,778 A | 9/1987 | Learn et al. | 118/728 |
| 4,695,217 A | 9/1987 | Lau | 414/404 |
| 4,724,963 A | 2/1988 | Mortensen | 206/454 |
| 4,768,328 A | 9/1988 | Mims | 53/532 |
| 4,808,456 A | 2/1989 | Yamada et al. | |
| 4,819,579 A | 4/1989 | Jenkins | 118/728 |

(Continued)

FOREIGN PATENT DOCUMENTS

EP 0 177 073 8/1985

(Continued)

OTHER PUBLICATIONS

Mar. 12, 2005 Invitiation to Respond to Written Opinion from Intellectual Property Office of Singapore to Tan Jinhwee, Eunice & Lim Chooeng.

(Continued)

*Primary Examiner*—Rodney G McDonald
(74) *Attorney, Agent, or Firm*—McCarthy Law Group

(57) ABSTRACT

Various apparatus and methods are provided for handling and transporting pairs of disks. A transfer tool engages a pair of disks in gap merge orientation along the outer perimeter edge of the disks and maintains the orientation while transferring the pair of disks to a second location where the disks are transferred to other equipment or subjected to processing. Various disks carriers are also provided for handling and transporting multiple pairs of disks in gap merge orientation.

38 Claims, 8 Drawing Sheets

U.S. PATENT DOCUMENTS

| | | | |
|---|---|---|---|
| 4,840,530 A | 6/1989 | Nguyen | 414/404 |
| 4,856,957 A | 8/1989 | Lau et al. | 414/404 |
| 4,886,412 A * | 12/1989 | Wooding et al. | 414/416.05 |
| 4,939,891 A | 7/1990 | Podini | |
| 4,947,624 A | 8/1990 | Cones, Sr. et al. | 53/540 |
| 4,947,784 A | 8/1990 | Nishi | 414/404 |
| 4,949,848 A | 8/1990 | Kos | 211/41 |
| 4,958,982 A | 9/1990 | Champet et al. | 414/751.1 |
| 4,962,879 A | 10/1990 | Goesele et al. | 228/116 |
| 4,981,222 A | 1/1991 | Lee | 211/41 |
| 4,981,408 A * | 1/1991 | Hughes et al. | 414/217 |
| 4,987,407 A | 1/1991 | Lee | 340/540 |
| 5,007,788 A | 4/1991 | Asano et al. | 414/416.09 |
| 5,111,936 A | 5/1992 | Kos | 206/334 |
| 5,125,784 A | 6/1992 | Asano | 414/404 |
| 5,188,499 A | 2/1993 | Tarng et al. | 414/404 |
| 5,250,339 A | 10/1993 | Tani et al. | |
| 5,269,643 A | 12/1993 | Kodama et al. | 414/416 |
| 5,314,107 A | 5/1994 | D'Aragona et al. | 228/116 |
| 5,348,151 A | 9/1994 | Dressen | 206/334 |
| 5,351,156 A | 9/1994 | Gregory et al. | |
| 5,430,992 A | 7/1995 | Olson | 53/399 |
| 5,456,978 A * | 10/1995 | Lal et al. | 428/332 |
| 5,476,176 A | 12/1995 | Gregerson et al. | 206/711 |
| 5,478,622 A | 12/1995 | Nakamura et al. | |
| 5,486,134 A | 1/1996 | Jones et al. | 451/209 |
| 5,497,085 A | 3/1996 | Tian et al. | |
| 5,501,568 A | 3/1996 | Ono | 414/417 |
| 5,538,230 A * | 7/1996 | Sibley | 269/296 |
| 5,612,830 A | 3/1997 | Gregory et al. | |
| 5,620,295 A | 4/1997 | Nishi | 414/416.11 |
| 5,664,407 A | 9/1997 | Cooper, III et al. | 53/542 |
| 5,665,478 A | 9/1997 | Suzuki et al. | |
| 5,773,124 A | 6/1998 | Ishikawa et al. | |
| 5,780,127 A | 7/1998 | Mikkelsen | 428/35.7 |
| 5,820,449 A | 10/1998 | Clover | 451/287 |
| 5,906,469 A | 5/1999 | Oka et al. | 414/416 |
| 5,926,352 A | 7/1999 | Murayama et al. | |
| 5,928,759 A | 7/1999 | Arita et al. | |
| 5,956,317 A | 9/1999 | Komiyama et al. | 369/286 |
| 5,976,255 A | 11/1999 | Takaki et al. | 118/500 |
| 5,991,104 A | 11/1999 | Bonyhard | |
| 6,007,896 A | 12/1999 | Bhushan | |
| 6,033,486 A | 3/2000 | Andros | |
| 6,033,522 A | 3/2000 | Iwata et al. | 156/345 |
| 6,036,031 A * | 3/2000 | Ishikawa | 211/41.18 |
| 6,065,615 A * | 5/2000 | Uchiyama et al. | 211/41.18 |
| 6,086,961 A | 7/2000 | Bonyhard | |
| 6,107,599 A | 8/2000 | Baumgart et al. | 219/121.77 |
| 6,117,570 A | 9/2000 | Chen et al. | |
| 6,120,890 A | 9/2000 | Chen et al. | |
| 6,150,015 A | 11/2000 | Bertero et al. | |
| 6,182,814 B1 | 2/2001 | Koehler | 198/418.7 |
| 6,230,891 B1 | 5/2001 | Usui et al. | |
| 6,345,947 B1 | 2/2002 | Egashira | 414/225.01 |
| 6,354,794 B2 | 3/2002 | Sato et al. | 414/811 |
| 6,368,040 B1 | 4/2002 | Yamasaki et al. | 414/222 |
| 6,427,850 B2 | 8/2002 | Mendiola | 211/41.18 |
| 6,457,929 B1 | 10/2002 | Sato et al. | 414/404 |
| 6,498,086 B1 | 12/2002 | Zheng | |
| 6,582,279 B1 | 6/2003 | Fox et al. | 451/37 |
| 6,595,028 B1 | 7/2003 | Miyamoto et al. | |
| 6,596,083 B2 | 7/2003 | Cromwell et al. | |
| 6,612,801 B1 | 9/2003 | Koguchi | 414/416.02 |
| 6,625,835 B1 | 9/2003 | Frost et al. | 15/77 |
| 6,626,744 B1 | 9/2003 | White et al. | 451/66 |
| 6,664,503 B1 | 12/2003 | Hsieh et al. | |
| 6,769,855 B2 | 8/2004 | Yokomori et al. | 414/416.02 |
| 6,818,331 B2 | 11/2004 | Sakawaki et al. | |
| 6,821,653 B2 | 11/2004 | Fukushima et al. | |
| 6,926,977 B2 | 8/2005 | Osawa et al. | |
| 6,942,933 B2 | 9/2005 | Osawa | |
| 7,052,739 B2 * | 5/2006 | Buitron et al. | 427/430.1 |
| 7,168,153 B2 * | 1/2007 | Buitron et al. | 29/603.04 |
| 2001/0049031 A1 | 12/2001 | Bajorek et al. | |
| 2001/0053444 A1 | 12/2001 | Yokoyama et al. | |
| 2002/0006324 A1 | 1/2002 | Sato et al. | 414/416.12 |
| 2002/0054976 A1 | 5/2002 | Nakamura et al. | |
| 2002/0055017 A1 | 5/2002 | Fukushima et al. | |
| 2002/0081181 A1 | 6/2002 | Yokomori et al. | |
| 2002/0132043 A1 | 9/2002 | Cromwell et al. | |
| 2002/0142707 A1 | 10/2002 | Shimada et al. | |
| 2002/0159177 A1 | 10/2002 | Aoki et al. | |
| 2003/0082407 A1 | 5/2003 | Sakawaki et al. | |
| 2003/0104253 A1 | 6/2003 | Osawa et al. | |
| 2003/0179692 A1 | 9/2003 | Ohotomo | |
| 2003/0208899 A1 | 11/2003 | Grow et al. | 29/458 |
| 2003/0209389 A1 | 11/2003 | Buitron et al. | 184/6 |
| 2003/0209421 A1 | 11/2003 | Buitron et al. | |
| 2003/0210498 A1 | 11/2003 | Kim et al. | 360/135 |
| 2003/0211275 A1 | 11/2003 | Buitron et al. | 428/64.1 |
| 2003/0211361 A1 | 11/2003 | Kim et al. | 428/694 R |
| 2004/0005481 A1 | 1/2004 | Osawa | |
| 2004/0013011 A1 | 1/2004 | Valeri | 365/200 |
| 2004/0016214 A1 | 1/2004 | Buitron | 53/474 |
| 2004/0023074 A1 | 2/2004 | Shimizu et al. | |
| 2004/0035737 A1 | 2/2004 | Buitron et al. | 206/454 |
| 2004/0037005 A1 | 2/2004 | Osawa | |
| 2004/0068862 A1 | 4/2004 | Buitron et al. | 29/604 |
| 2004/0069662 A1 | 4/2004 | Buitron et al. | 206/307.1 |
| 2004/0070092 A1 | 4/2004 | Buitron et al. | 264/1.33 |
| 2004/0070859 A1 | 4/2004 | Crofton et al. | 360/1 |
| 2004/0071535 A1 | 4/2004 | Crofton et al. | 414/416.09 |
| 2004/0072029 A1 | 4/2004 | Lowery et al. | |
| 2004/0170870 A1 | 9/2004 | Yokoyama et al. | |
| 2005/0003106 A1 | 1/2005 | Isozaki | |
| 2005/0037140 A1 | 2/2005 | Sakawaki et al. | |
| 2005/0121839 A1 | 6/2005 | Fukushima et al. | |
| 2005/0132958 A1 | 6/2005 | Leng et al. | |

FOREIGN PATENT DOCUMENTS

| | | | |
|---|---|---|---|
| EP | 0 192 244 | 2/1986 | |
| EP | 768704 | 4/1997 | 414/416.02 |
| JP | 63122527 A | 5/1988 | |
| JP | 04067333 A | 3/1992 | |
| JP | 05028533 A | 2/1993 | |
| JP | 06076384 A | 3/1994 | |
| JP | 7-263521 | 10/1995 | 414/416.02 |
| JP | 07296418 A | 11/1995 | |
| JP | 08249802 A | 9/1996 | |
| JP | 08273210 | 10/1996 | |
| JP | 10228674 A | 8/1998 | |
| JP | 11265506 A | 9/1999 | |
| JP | 2001232667 | 8/2001 | |
| WO | WO 9836867 A1 | 8/1998 | |

OTHER PUBLICATIONS

"Design of an active memory system for network applications"; Asthana, A.; Cravatts, M.; Krzyzanowski, P.; Memory Technology, Design and Testing, Aug. 8-9, 1994; p. 58-63.

Pang et al., Effects of NiP Sub-Seedlayer on CoCrPtTa/CoCrTa/CrTi/NiAl Thin Film Media for Glass Substrate, *IEEE Transactions on Magnetics*, pp. 1494-1496 (vol. 37 No. 4 Jul. 2001).

"DVD technology"; Tsinberg, M. Eggrs, C.; Image Processing, 1998 ICIP 98 Proceedings. 1998 Int'l Conf on vol. 1; Oct. 4-7, 1998, p. 2: 2 vol. 1.

US 5,762,201, 06/1998, Whalen (withdrawn)

\* cited by examiner

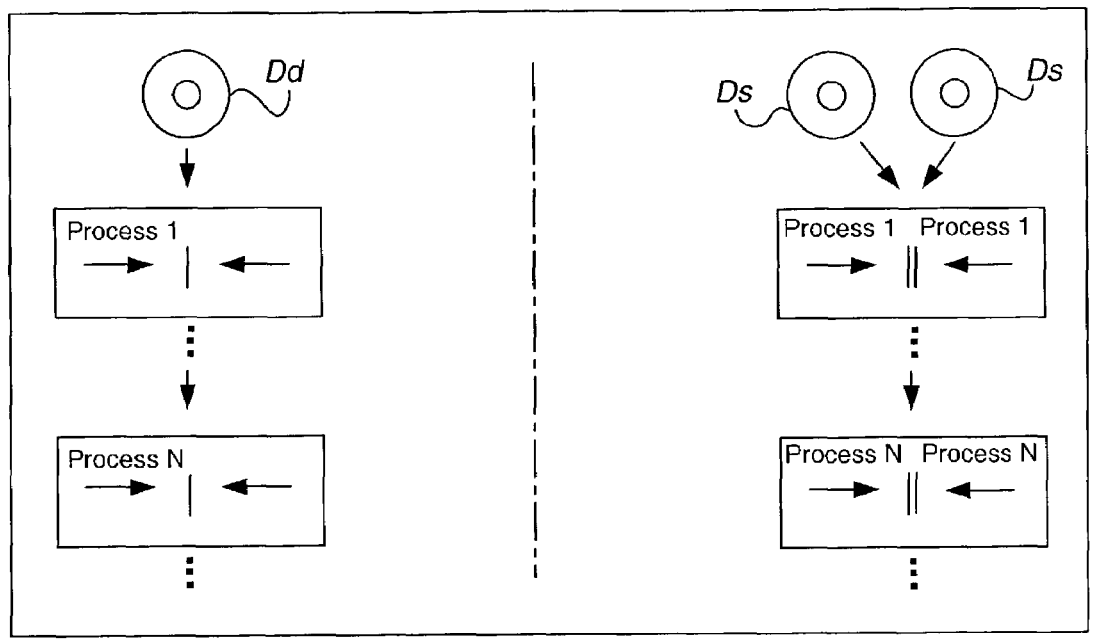
Fig. 1
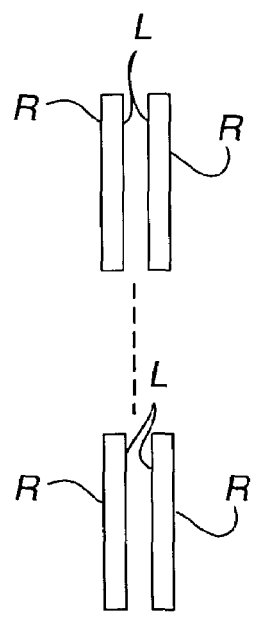  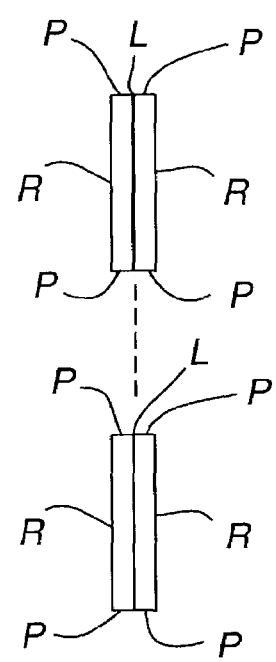  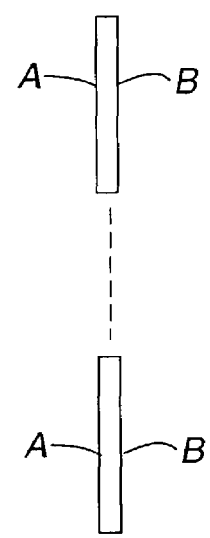
Fig. 2    Fig. 3    Fig. 4

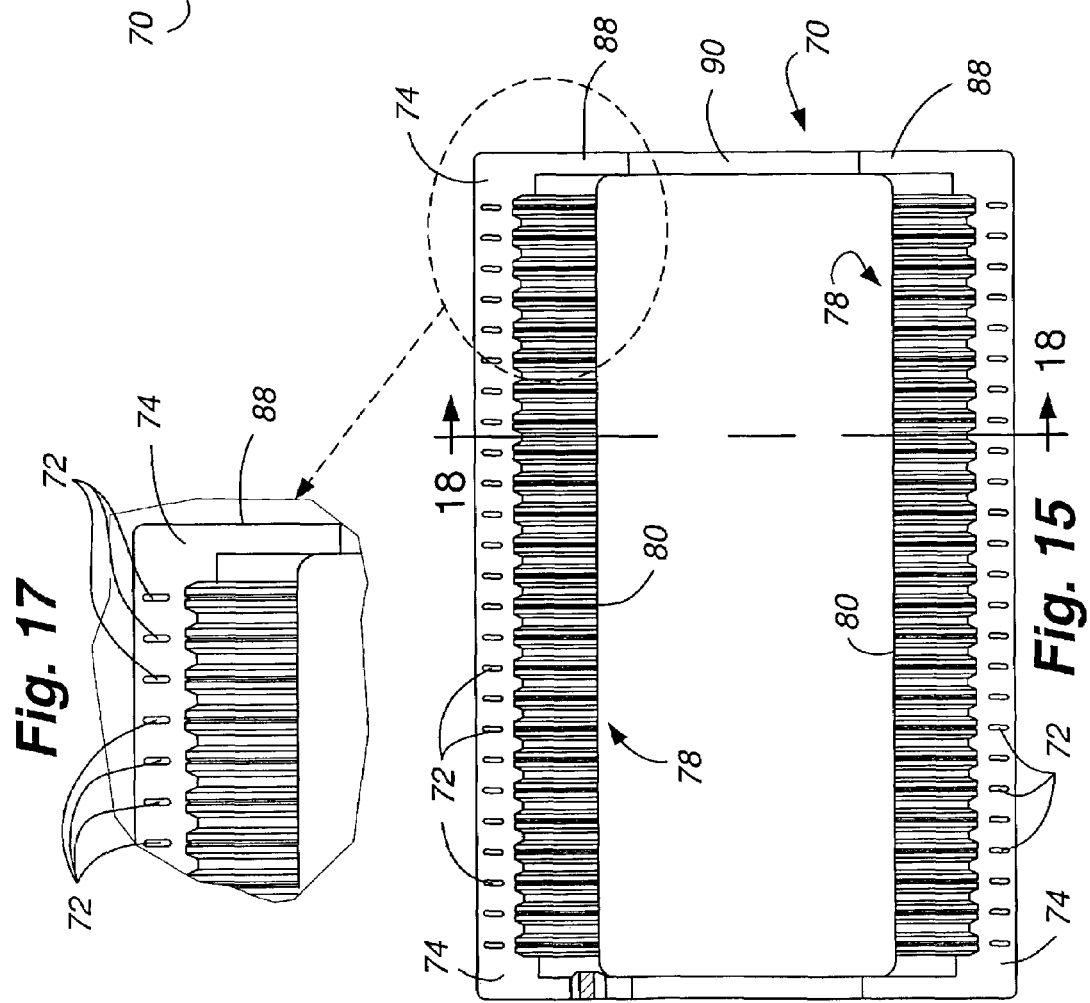

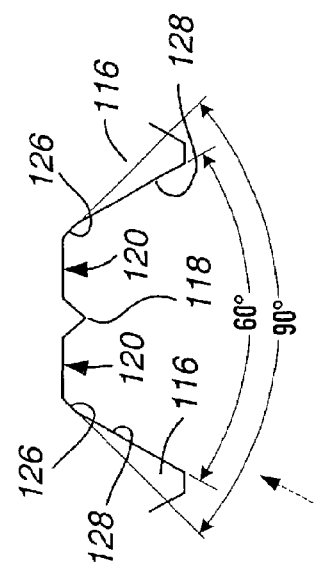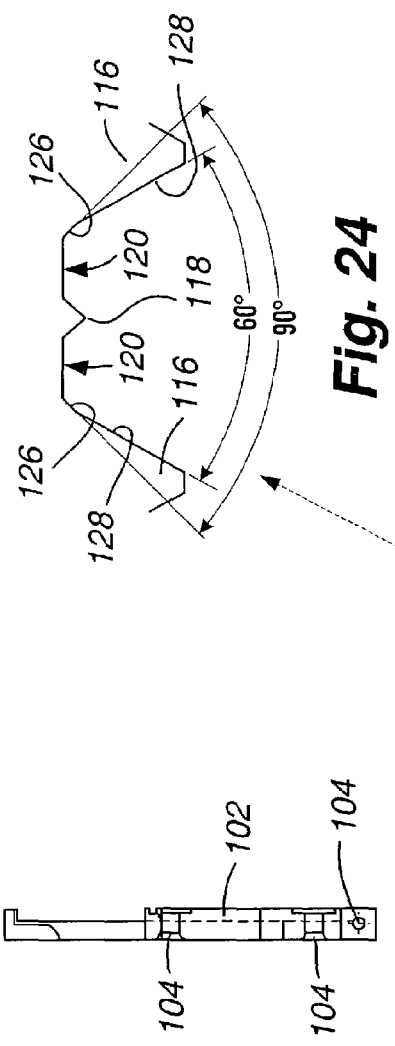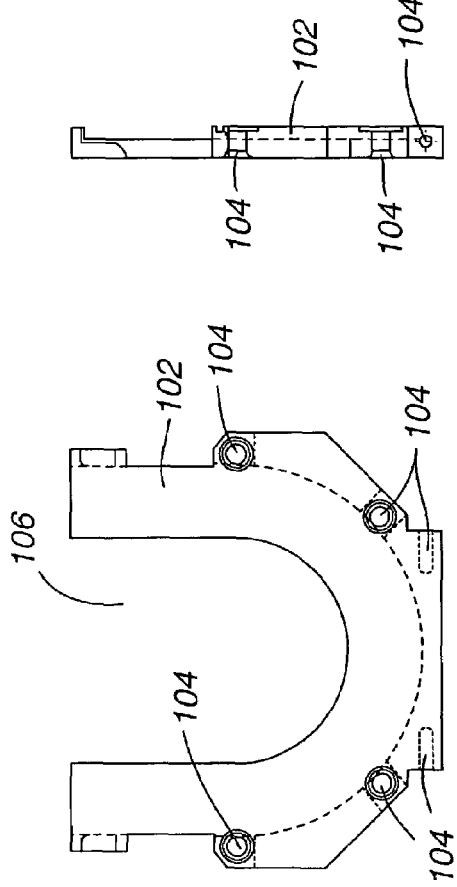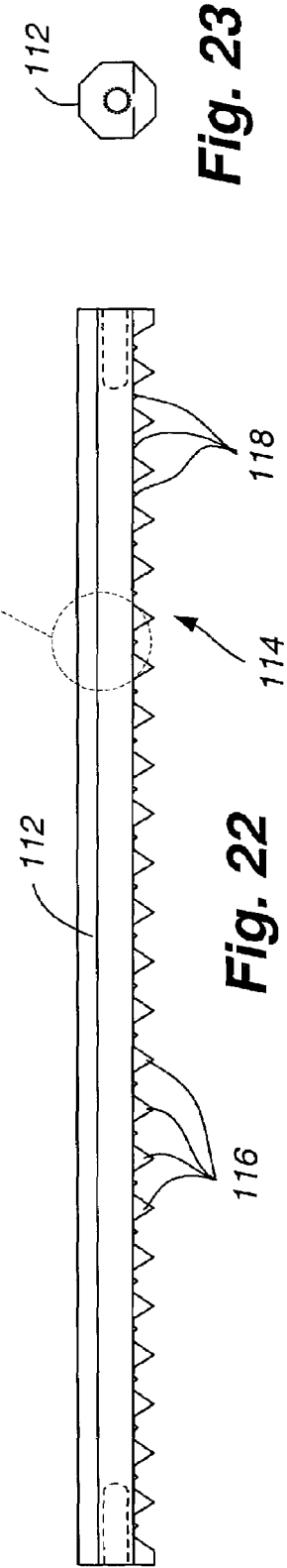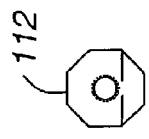

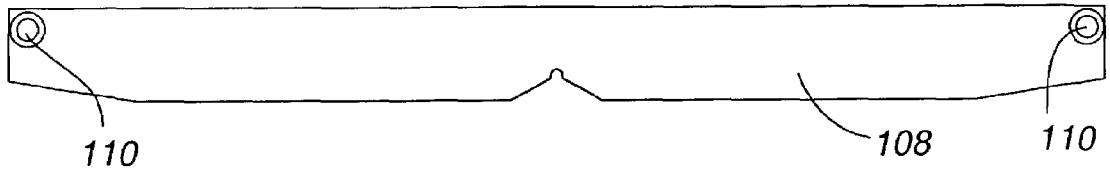
Fig. 25
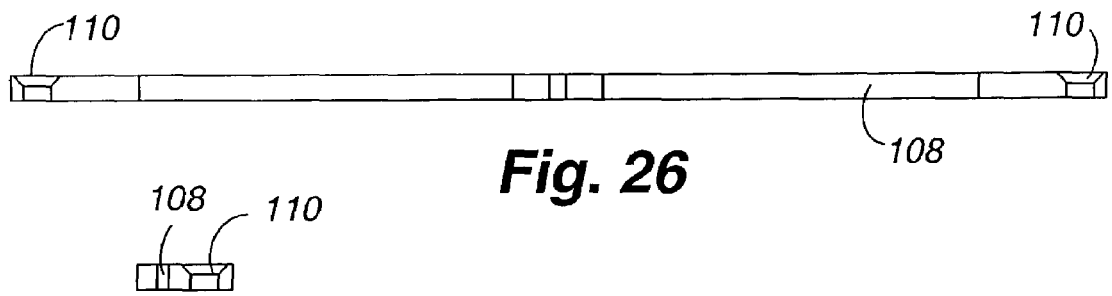
Fig. 26
Fig. 27
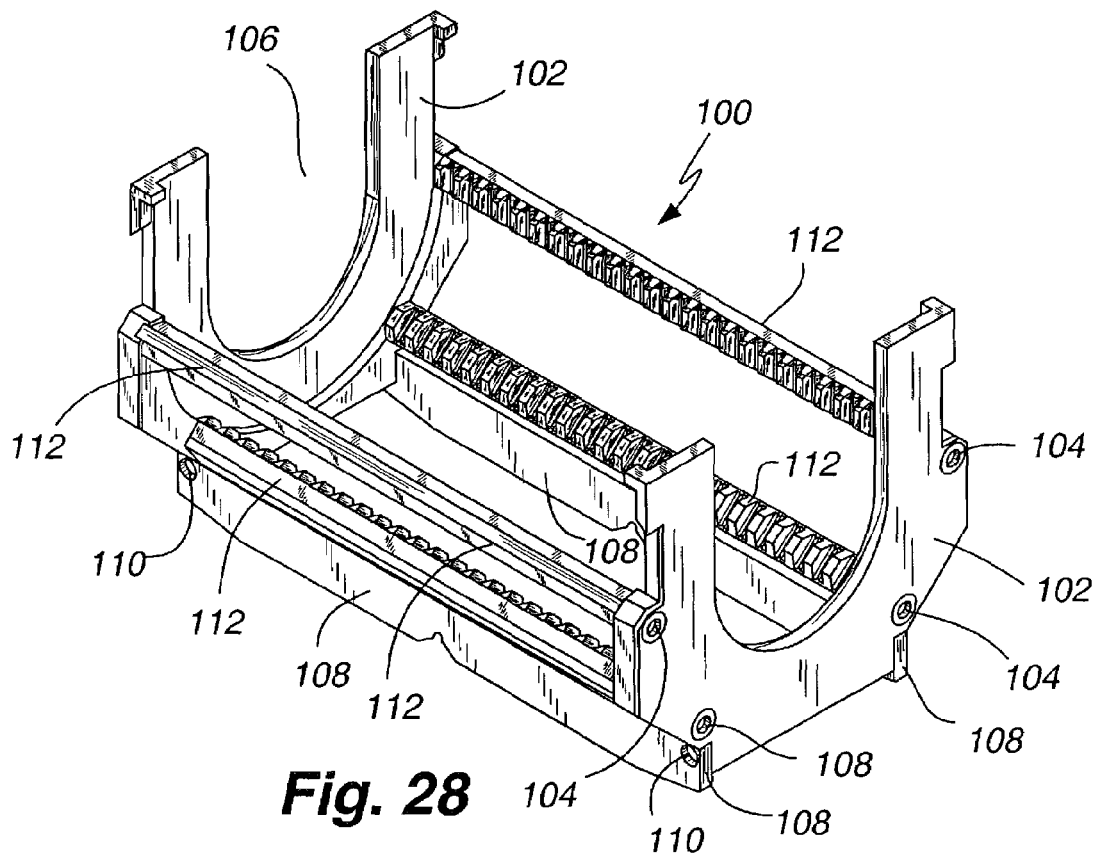
Fig. 28

W-PATTERNED TOOLS FOR TRANSPORTING/HANDLING PAIRS OF DISKS

CROSS REFERENCE TO RELATED APPLICATION

Priority is claimed from U.S. Provisional Patent Application Ser. No. 60/379,008 filed May 9, 2002, which is incorporated by reference herein in its entirety.

The subject matter of the present application is related to the following applications, each of which has a filing date of May 9, 2003; application Ser. No. 10/434,550 entitled Single-Sided Sputtered Magnetic Recording Disks to Clasara et al. (Publication No. U.S.-2003-0211361-A1); application Ser. No. 10/435,361 entitled Dual Disk Transport Mechanism Processing Two Disks Tilted Toward Each Other to Grow et al. (Publication No. U.S.-2003-0208899-A1); application Ser. No. 10/435,358 entitled Information-Storage Media With Dissimilar Outer Diameter and/or Inner Diameter Chamfer Designs On Two Sides to Clasara et al. (Publication No. U.S.-2003-0210498-A1); application Ser. No. 10/435,360 entitled Method of Merging Two Disks Concentrically Without Gap Between Disks to Buitron (Publication No. U.S.-2004-0016214-A1); application Ser. No. 10/434,551 entitled Apparatus for Combining or Separating Disk Pairs Simultaneously to Buitron et al. (Publication No. U.S.-2004-0035737-A1); application Ser. No. 10/435,572 entitled Method of Simultaneous Two-Disk Processing of Single-Sided Magnetic Recording Disks to Buitron et al. (Publication No. U.S.-2003-0211275-A1); application Ser. No. 10/435,295 entitled Method for Servo Pattern Application on Single-Side Processed Disks in a Merged State to Valeri (Publication No. U.S.-2004-0013011-A1); application Ser. No. 10/434,547 entitled Method for Simultaneous Two-Disk Texturing to Buitron et al. (Publication No. U.S.-2004-0070092-A1); application Ser. No. 10/435,227 entitled Cassette for Holding Disks of Multiple Form Factors to Buitron et al. (Publication No. U.S.-2004-0069662-A1); application Ser. No. 10/434,546 entitled Automated Merge Nest for Pairs of Magnetic Storage Disks to Crofton et al. (Publication No. U.S.-2004-0071535-A1); application Ser. No. 10/435,293 entitled Apparatus for Simultaneous Two-Disk Scrubbing and Washing to Crofton et al. (Publication No. U.S.-2004-0070859-A1); application Ser. No. 10/435,362 entitled Cassette Apparatus for Holding 25 Pairs of Disks for Manufacturing Process to Buitron et al. (Publication No. U.S.-2004-0068862-A1); and application Ser. No. 10/434,540 entitled Method of Lubricating Multiple Magnetic Storage Disks in Close Proximity to Buitron et al. (Publication No. U.S.-2003-0209389-A1). Each of these applications is incorporated by reference in its entirety as if stated herein. All of these applications are commonly owned by the Assignee.

FIELD OF THE INVENTION

The present embodiments are directed to various apparatus and methods for handling pairs of hard memory disks. More specifically, the apparatus and methods apply to handling a single pair of disks or a plurality of pairs of disks in various applications including the manufacture of single-sided hard memory disks and post-manufacture processes.

BACKGROUND OF THE INVENTION

Hard disk drives are an efficient and cost effective solution for data storage. Depending upon the requirements of the particular application, a disk drive may include anywhere from one to eight hard disks and data may be stored on one or both surfaces of each disk. While hard disk drives are traditionally thought of as a component of a personal computer or as a network server, usage has expanded to include other storage applications such as set top boxes for recording and time shifting of television programs, personal digital assistants, cameras, music players and other consumer electronic devices, each having differing information storage capacity requirements.

Typically, hard memory disks are produced with functional magnetic recording capabilities on both sides or surfaces of the disk. In conventional practice, these hard disks are produced by subjecting both sides of a raw material substrate disk, such as glass, aluminum or some other suitable material, to numerous manufacturing processes. Active materials are deposited on both sides of the substrate disk and both sides of the disk are subjected to full processing such that both sides of the disk may be referred to as active, or functional, from a memory storage stand point. The end result is that both sides of the finished disk have the necessary materials and characteristics required to effect magnetic recording and provide data storage. These are generally referred to as double-sided process disks. Assuming both surfaces pass certification testing, both sides of the disk may be referred to as active or functional for memory storage purposes. These disks are referred as double-sided test pass disks. Double-sided test pass disks may be used in a disk drive for double-sided recording.

Conventional double-sided processing of hard memory disks involves a number of discrete steps. Typically, twenty-five substrate disks are placed in a plastic cassette, axially aligned in a single row. Because the disk manufacturing processes are conducted at different locations using different equipment, the cassettes are moved from work station to work station. For most processes, the substrate disks are individually removed from the cassette by automated equipment, both sides or surfaces of each disk are subjected to the particular process, and the processed disk is returned to the cassette. Once each disk has been fully processed and returned to the cassette, the cassette is transferred to the next work station for further processing of the disks.

More particularly, in a conventional double-sided disk manufacturing process, the substrate disks are initially subjected to data zone texturing. Texturing prepares the surfaces of the substrate disks to receive layers of materials which will provide the active or memory storage capabilities on each disk surface. Texturing may typically be accomplished in two ways: fixed abrasive texturing or free abrasive texturing. Fixed abrasive texturing is analogous to sanding, in which a fine grade sand paper or fabric is pressed against both sides of a spinning substrate disk to roughen or texturize both surfaces. Free abrasive texturing involves applying a rough woven fabric against the disk surfaces in the presence of a slurry. The slurry typically contains diamond particles which perform the texturing, a coolant to reduce heat generated in the texturing process, and deionized water as the base solution. Texturing is typically followed by washing to remove particulate generated during texturing. Washing is a multi-stage process and usually includes scrubbing of the disk surfaces. The textured substrate disks are then subjected to a drying process. Drying is performed on an entire cassette of disk drives at a time. Following drying, the textured substrate disks are subjected to laser zone texturing. Laser zone texturing does not involve physically contacting and applying pressure against the substrate disk surfaces like data zone texturing. Rather, a laser beam is focused on and interacts with discrete portions of the disk surface, primarily to create an array of bumps for the head and slider assembly to land on and take off from. Laser zone texturing is performed one disk at a time. The disks are then washed again. Following a drying step, the disks are individually subjected to a process which adds layers of material to both surfaces for purposes of creating data storage capabilities. This can be accomplished by sputtering, deposition or by other techniques known to persons of skill in the art. Following the addition of layers of material to each surface, a lubricant layer typically is applied. The lubrication process can be accomplished by subjecting an entire cassette of disks to a liquid lubricant; it does not need to be done one disk at a time. Following lubrication, the disks are individually subjected to surface burnishing to remove asperities, enhance bonding of the lubricant to the disk surface, and otherwise provide a generally uniform finish to the disk surface. Following burnishing, the disks are subjected to various types of testing. Examples of testing include glide testing to find and remove disks with asperities that could affect flying at the head/slider assembly, and certification testing which is writing to and reading from the disk surfaces. Certification testing is also used to locate and remove disks with defects that make the surface unuseable for data storage. The finished disks can then be subjected to a servo-writing process and placed in disk drives, or placed in disk drives and then subjected to servo-writing. The data zone texturing, laser zone texturing, scrubbing, sputtering, burnishing and testing processes are done one disk at a time, with each surface of a single disk being processed simultaneously.

Although the active materials and manufacturing processes by their nature are difficult and expensive to employ, over the years the technology used to manufacture hard memory disks has rapidly progressed. As a result, the density of information that can be stored on a disk surface is remarkable. Indeed, double-sided test pass disks used in personal computers have much greater storage capacity than most consumers require during the useful life of the computer. Consumers thus are forced to pay substantial amounts for excess storage capacity, and the components to access the excess storage capacity. This has caused some disk drive manufacturers, in some current applications, to manufacture and sell disk drives which utilize only one side of a double-sided test pass disk for storage purposes, or which use the good side of a double-sided process disk where one surface passed certification testing and the second surface failed. In either case, the second surface, despite being fully processed, is unused. However, the disk drive manufacturer reduces its cost by eliminating the mechanical and electrical components needed to access the unused disk surface. These disk drives are referred to as single-side drives and are typically used in low-end or economy disk drives to appeal to the low cost end of the marketplace. Although this approach may reduce some cost, it does not reduce the wasted cost of manufacturing the unused storage surface of each disk. Thus, substantial savings can be achieved by not only manufacturing disks with a single active side, but doing so in a cost-effective manner.

In contrast to a double-sided disk, a single-sided disk has only one functional memory surface with active recording materials. It is not a double-sided process disk where one side is not accessed or where one side has failed testing. Rather, manufacturing processes are applied in a controlled manner only to one side of the disk using unique single-sided processing techniques. In contrast to conventional double-sided disks, active recording materials are only applied to, and full processing is only conducted on, one side of the disk. Thus, substantial savings are achieved by eliminating processing the second side of each disk.

Additionally, the present invention achieves advantages by utilizing conventional double-sided disk manufacturing equipment and processes, with limited modification. The present invention enables simultaneous processing of two substrate disks through the same equipment and processes used to manufacture double-sided disks. Simultaneously processing two substrate disks results in the production of two single-sided disks in the same time and using essentially the same equipment as currently is used in the production of one double-sided disk. However, each single-sided disk has only a single active surface. For illustrative purposes FIG. 1 shows a side-by-side schematic representation of the processing of one double-sided disk $D_d$, depicted on the left side of FIG. 1, versus the simultaneous processing of two single-sided disks $D_s$, depicted on the right side of FIG. 1. In each case, the double-sided disk or the two single-sided disks are subjected to the same process steps 1 through N, but the single-sided disk processing produces two disks in the same time the double-sided disk processing produces one disk.

A benefit provided by simultaneous single-sided processing of disks is a substantial cost savings achieved by eliminating the application of materials to and processing of one side of each disk. A further and potentially significant cost savings can be achieved by utilizing existing double-sided disk processing equipment, with limited modification, to process pairs of single-sided disks. A still further benefit is a substantial increase in production (or reduction in processing time depending upon perspective). By utilizing existing double-sided disk processing equipment, approximately twice the productivity of a conventional double-sided production process is achieved (on the basis of numbers of disks produced) in the production of single-sided disks. Moreover, these increased productivity levels are achieved at approximately the same material cost, excepting the substrate disk, as producing half as many double-sided disks.

The simultaneous processing is achieved by combining two substrate disks together into a substrate disk pair or disk pair. A disk pair is two substrate disks that are oriented in a back-to-back relationship, with the back-to-back surfaces either in direct physical contact or closely adjacent with a slight separation. The separation can be achieved with or without an intervening spacer. The substrate disk pair progresses through each process step in much the same way as one double-sided disk, but with only the outwardly facing surface of each disk in the pair being subjected to the full process. Thus, the outwardly facing surface of each pair becomes the active surface, and the inwardly facing surface of each pair remain inactive, or non-functional.

For convenience and understanding, the following terms will have the definitions set forth:

a) "R-side" and "L-side" refer to the active side and inactive side of a disk, respectively. R-side is the side that does or will have active recording materials and memory capability. The R-side may also be referred to as the active side. The L-side is the side that has little or no active recording materials or memory capabilities; it is non-functional from a data storage stand point.

b) "Merge" means to bring two disks closer together to form a pair of disks, a disk pair or a substrate pair.

c) "Demerge," conversely, means that a merged pair of disks is separated from each other.

d) "Disk" means a finished memory disk and all predecessor configurations during the manufacturing process starting with a substrate disk and progressing to a finished memory disk, depending upon the context of the sentence in which it is used.

e) "Disk pair" or "substrate pair" means two disks positioned in contact merge, gap merge or spacer merge orientation.

f) "Double-sided disk" means a single disk which has been subjected to double-sided processing, whether or not both sides of the disk have passed testing or only one side has passed testing.

g) "Gap merge" means a pair of disks that have been merged, but a space is maintained between the two merged disks. One or more spacers may or may not be used to maintain the gap or space. Gap merge includes both concentric and non-concentric merge. It should be understood that there is no precise dimension or limit to the space between the disks that causes them to be gap merged. Gap merge also includes the situation where the gap between the disks gradually decreases from one perimeter edge to the opposite perimeter edge of the disks when the two disks are angled toward each other. An example is when the bottom perimeter edges of the disks are spaced apart and the upper perimeter edges are in contact.

h) "Single-sided disks" means a single disk which has been subjected to single-side processing, where only one surface of the disk is fully processed.

i) "Spacer merge" means a spacer body is used to create spacing between two gap-merged disks.

j) "Contact merge" means a merged pair of disks where the inside surface of each disk is in contact with the inside surface of the other disk. Contact merge includes concentric and non-concentric merge.

k) "Concentric merge" means that two merged disks have the same axis and, assuming the two disks have the same outside diameter and inside diameter (as defined by the center aperture), their outer and inner perimeter edges are aligned.

l) "Concentric contact merge" means a pair of disks that are oriented in both a contact merge and a concentric merge.

m) "Non-concentric merge" or "off-centered merge" means the two merged disks are not concentric to each other or their perimeter edges are not aligned.

n) "Non-concentric contact merge" means the two contact merged disks are not concentric to each other or their perimeter edges are not aligned.

Referring to FIG. 2, a cross-section of a pair of gap-merged disks is shown. The R-side (active side) is the outwardly facing surface R of each disk within the pair. The L-side (inactive side) is the inwardly facing surface L of each disk within the pair. In comparison, a cross-section of a pair of concentric contact merged disks is shown in FIG. 3. The relative orientation of the R-side and L-side of each disk remains the same, however, the L-side of each disk of the pair are in contact and the outer and inner perimeter P of each disk is aligned with the outer and inner perimeter P of the other disk.

A conventional double-sided disk is shown in FIG. 4. The left side surface is referred to as the "A" side and the right side surface is referred to as the "B" side. Both the A and B sides are subjected to processing, including the addition of active or magnetic materials. In contrast, with reference to FIGS. 2 and 3, the R-side of each disk in a pair of disks is oriented on the outside of the pair and is subjected to processing in the same fashion as the A and B sides of a double-sided disk. Conversely, the L-side of each disk in a pair of disks is oriented on the inside of the pair and is not subjected to full processing in the same fashion as the A and B sides of a double-sided disk.

SUMMARY OF THE INVENTION

These and other benefits are addressed by the various embodiments and configurations of the present embodiments. For example, a benefit provided by some embodiments of the present invention is the ability to handle and transport two disks or substrate disks as a single pair of disks. Another benefit is that the pair of disks can be positioned in close proximity to each other, including being in a gap merge orientation. The ability to handle and manipulate pairs of disks in this manner affords yet another benefit which is the ability to simultaneously process pairs of disks using existing processing equipment originally designed and built for manufacturing conventional double-sided disks one at a time. In turn, these advantages allow increased output in the production of finished disks by the ability to process two disks simultaneously.

In some embodiments, a lift saddle is provided for removing single pairs of disks from a cassette, or for vertically transporting single pairs of disks. The lift saddle includes two adjacent parallel grooves for holding a pair of disks in gap merge orientation. The saddle is curved to engage the disk pair along a bottom portion of their outer perimeter edge. A wedge or rib member may be positioned between the two grooves to maintain the desired spacing, or gap, between the two disks. This embodiment is preferably used in the texturing and cleaning processes to remove disk pairs from cassettes or to return disk pairs to a cassette.

In other embodiments, a lift member is provided for handling single pairs of disks in a gap merge orientation. In those embodiments, the disk pair is engaged at three distinct and spaced apart points by three blades affixed to the lift member. The blades have a disk contacting edge that is generally W-shaped, forming two side-by-side slots with a center rib or tooth to maintain gap merge orientation. This embodiment is ideally suited for high temperature environments such as sputtering.

Other embodiments are provided for handling and transporting multiple pairs of disks positioned in gap merge orientation. In these embodiments, a disk cassette or container has a series of grooves formed on the opposed inside surface of the side walls. The grooves are formed by an alternating series of large and small ribs. The large ribs separate one pair of disks from the adjacent pairs of disks, and the small ribs separate the two disks comprising each pair of disks. The large and small ribs also provide and maintain desired spacing in order that the disk pairs may be efficiently engaged by other processing equipment. These embodiments, when constructed from high temperature resistant metal, are preferred for use in the sputtering process.

Other embodiments are also disclosed for handling and transporting disks. One unique aspect of these embodiments is its interchangeability and modularity. The four side wall members are identical. If one or more wear out, they are easily replaced. Also, if it is desired to alter the orientation of the disks, a differently configured side wall may be substituted. Similarly, side walls of different lengths can be substituted to provide cassettes that hold fewer or greater numbers of disks or that accommodate different disk thicknesses. This modularity allows disk manufacturers to readily accommodate different cassette configurations without maintaining an inventory of multiple types of cassettes.

BRIEF DESCRIPTION OF THE DRAWINGS

FIG. 1 is a schematic of a double-sided disk manufacturing process, on the left, and a schematic of a single-sided disk manufacturing process, on the right.

FIG. 2 is a cross-section of a pair of gap merged disks.

FIG. 3 is a cross-section of a pair of concentric contact merged disks.

FIG. 4 is a cross-section of a conventional double-sided process disk.

FIG. 15 is a top plan view of other embodiments of the present invention.

FIG. 16 is an end elevation view of the embodiments of FIG. 15.

FIG. 17 is a partial enlarged view of the embodiments of FIG. 15.

FIG. 18 is a cross-section taken along line 18-18 of FIG. 15.

FIG. 19 is an enlarged detail of the cross-section of a side wall of the embodiments shown in FIG. 15.

FIG. 20 is an end plan view of other embodiments of the present invention shown in FIG. 28.

FIG. 21 is a side plan view of the embodiments of FIG. 20.

FIG. 22 is a top plan view of a side wall member of the embodiments shown in FIG. 28.

FIG. 23 is an end plan view of the embodiments shown in FIG. 22.

FIG. 24 is an enlarged detail of the portion of the embodiments shown in FIG. 22.

FIG. 25 is a front plan view of the base member of the embodiments shown in FIG. 28.

FIG. 26 is a top plan view of the embodiments of FIG. 25.

FIG. 27 is an end plan view of the embodiments of FIG. 25.

FIG. 28 is a perspective view of other embodiments of the present invention.

It should be understood that the drawings are not necessarily to scale. In certain instances, details which are not necessary for an understanding of the invention or which render other details difficult to perceive may have been omitted. It should be understood, of course, that the invention is not necessarily limited to the particular embodiments illustrated herein.

DETAILED DESCRIPTION

Figure 5:
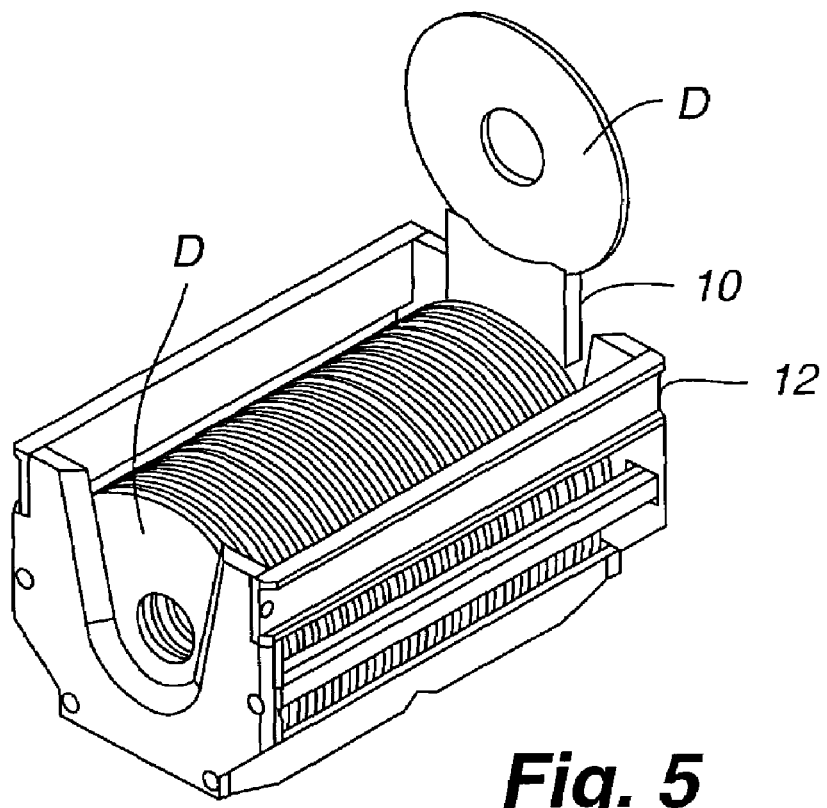
FIG. 5 is a perspective view of embodiments of the present invention removing a pair of disks from a cassette.

In some embodiments of the present invention, a transfer tool or lift saddle 10 is provided for transferring a pair of disks in a gap merge orientation either from or to a cassette or container 12. As shown in FIG. 5, the lift saddle moves vertically through the bottom and top openings of the cassette between a first position beneath the cassette to a second position generally at or near the top of the cassette. In its movement between lower to upper positions, the lift saddle engages and lifts two disks from a cassette and transfers them to a position where the pair of disks are engaged by other automated processing equipment. The other processing equipment may include a second transfer tool which moves the pair of disks to another location for processing. Alternatively, the disks may be processed on the lift saddle at its upper position. The lift saddle is also used to return the pairs of disks to a cassette following processing.

Figure 11:
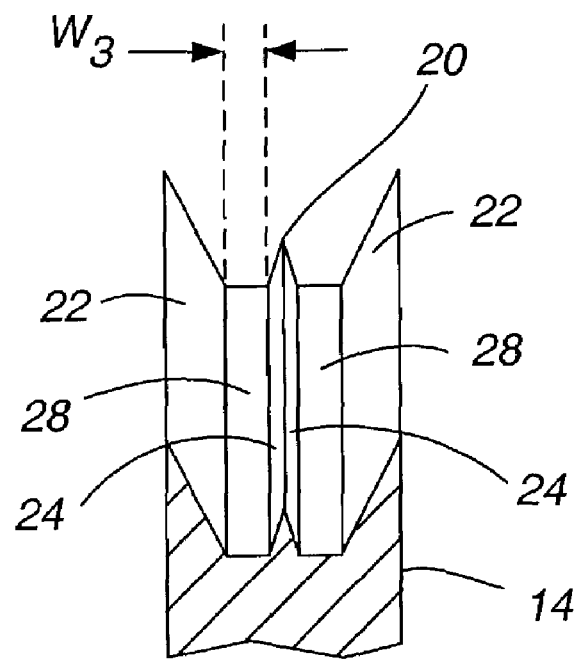
FIG. 11 is an enlarged partial cross-section of other embodiments of the present invention.
Figures 6, 7, 8, 9, 10:
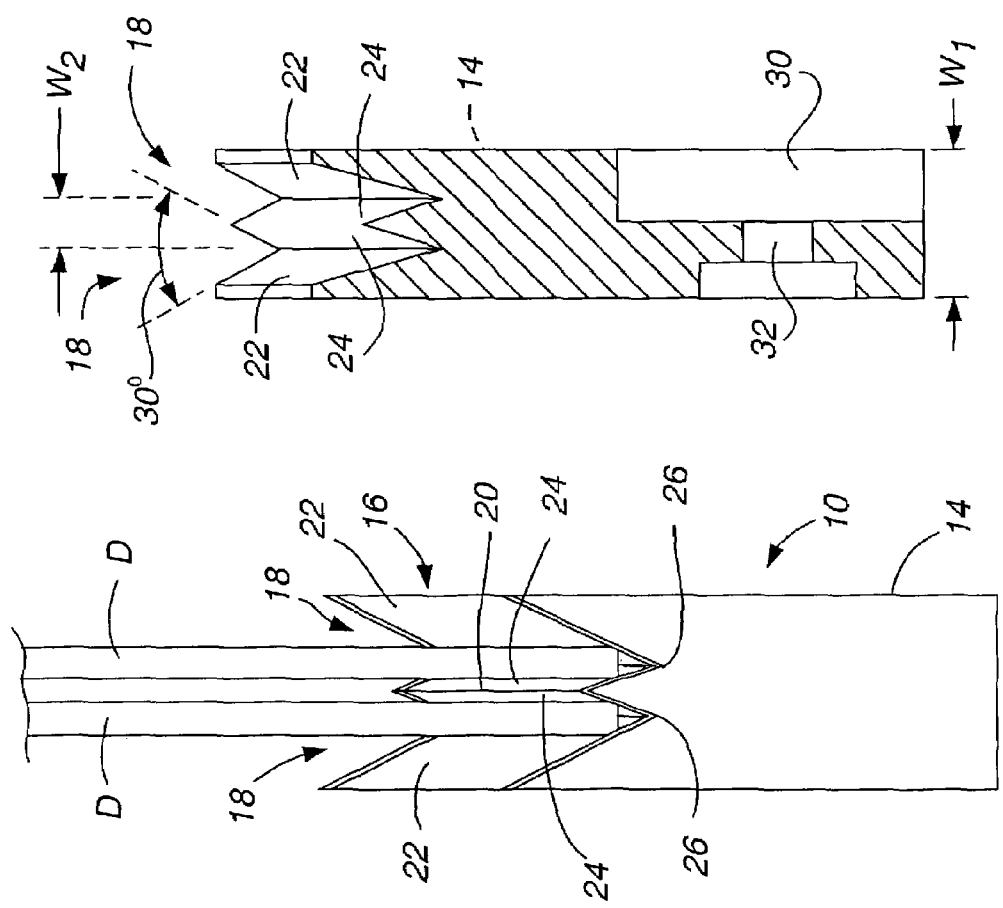
FIG. 6 is a front elevation of embodiments of the present invention.
FIG. 7 is a side elevation of the embodiments of FIG. 6.
FIG. 8 is a cross-section taken along line 8-8 of FIG. 7.
FIG. 9 is an end plan view of the embodiments of FIG. 7.
FIG. 10 is a cross-section taken along line 10-10 of FIG. 9.

With reference to FIGS. 6-10, the lift saddle comprises a main body 14 with a curved or arcuate disk engaging portion 16. The radius of the curved or arcuate shape is intended to approximate the radius of the disks. However, if the lift saddle will be used in processes that increase the temperature of the disks, such as sputtering, the curve should be slightly larger than the radius of the disk to accommodate thermal expansion of the disks. As best seen in FIG. 8, the disk engaging portion has a generally W-shaped cross-section comprising two adjacent parallel grooves 18. More specifically, a center ridge, or rib, 20 is provided to maintain the prescribed spacing between the pair of disks. Thus, two channels are provided, each designed for separately engaging and holding one disk of the pair in a gap merge orientation. The bottom of each channel, formed by the outer side wall 22 and inner side wall 24, terminates at an apex 26, as shown in FIGS. 6, 8. The angle formed by the inside and outside walls of each channel is designed to provide a width to the channel sufficient to accommodate the particular thickness of the disks, as well as to generally match any chamfer formed in the outer perimeter edges of the disks. (See FIG. 6.) If the disks are chamfered, the angle of the side walls and chamfer preferably match, providing additional stability in holding the disk during transport operations. In other embodiments of the lift saddle, shown in cross-section in FIG. 11, the channels 18 may be formed with a flat bottom surface 28. The width $W_3$ of the flat portion preferably matches the thickness of the disk, minus the chamfered portions of the disk perimeter edge, if any.

In some embodiments, a cutout or hollow portion 30 is provided in one side of the main body 14 of the lift saddle to accommodate the distal end of a lift rod. The lift rod moves the saddle vertically between its lower and upper positions. A pair of apertures 32 is provided in the main body of the lift saddle to accommodate locking screws or other securement devices to secure the lift saddle to the lift rod. As best illustrated in FIG. 8, the cutout portion 30 allows the lift rod to fit flush within the main body portion to minimize the width of the lift saddle. This permits the lift saddle to be utilized with conventional double-sided disk processing equipment and to move a pair of single-sided disks within spaces originally designed and built to accommodate a single double-sided disk. For example, the width $W_1$ of the saddle illustrated in FIG. 8 is 0.250 inches. The center-to-center distance of the two channels $W_2$ is 0.085 inches and the angle formed between the side walls 22 and 24 is 30 degrees (FIG. 8). This geometry will accommodate two disks with a thickness of 0.050 inches, as shown in FIG. 6. This is important because the disk temperature is ambient (room temperature) at the beginning of the sputtering process and may approach 300 degrees Celsius during the sputtering process. Moreover, at this elevated temperature, the disk will expand, perhaps by as much as seven percent.

It should be appreciated that the dimensions of the disk engaging portions of the lift saddle can change depending upon the size of the disks involved. In addition, the lift saddle may be machined from a single block of high-temperature-resistant material to not only provide greater precision and accuracy in forming the disk engaging portions 16 of the saddle, but to allow the lift saddle to operate in high temperature environments during disk processing. During processing of hard memory disks, the disks are subjected to temperatures that can reach 350 degrees Celsius. One example of a high temperature environment is the sputtering process where pairs of disks will be removed from a cassette, subjected to numerous sputtering steps and ultimately returned to a cassette. Machining of the disk contact surfaces, such as inside and outside walls 22, 24 of the two channels 18, allows the lift saddle to handle both hot or cold disks. Acceptable metals that can withstand these extreme temperature changes include 304 and 316 stainless steel (full hard). Alternatively, depending upon the application environment, the disk saddle may be made from plastic. For example, for low temperature environments, such as below 40 degrees Celsius, the lift saddle may be molded from polyesteresterketone (PEEK). PEEK provides good rigidity and is not abrasive. In high temperature environments, such as up to 350 degrees Celsius, the lift saddle also may be made from polyesteresterketone. Examples of this are sold under the trade names Vespel or Ultem.

Figure 12:
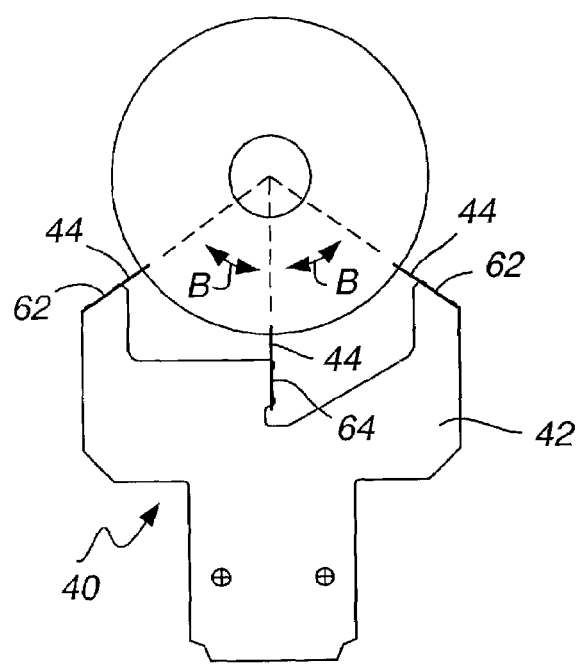
FIG. 12 is a front plan view of other embodiments of the present invention.
Figure 13:
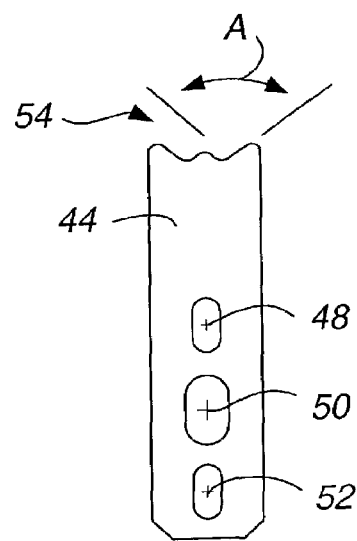
FIG. 13 is a front elevation of a blade element.
Figure 14:
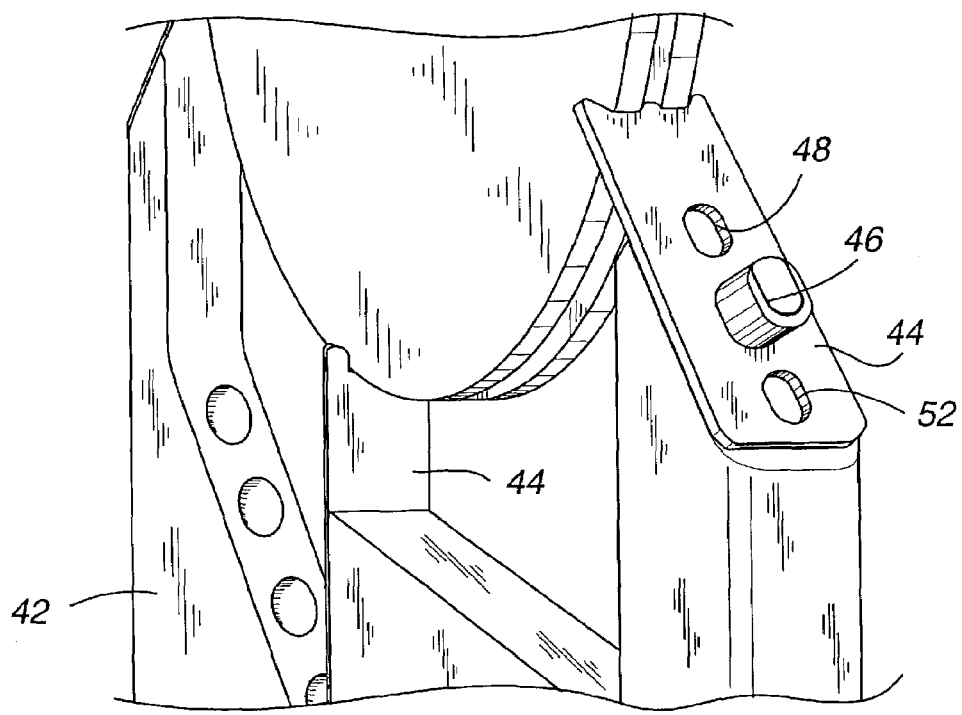
FIG. 14 is an enlarged partial perspective of the embodiments of FIG. 12.

Other embodiments of a transfer tool or lift member 40 is shown in FIGS. 12-14. Unlike the transfer tool of the previous embodiments, the lift member shown here contacts each disk in three discrete locations rather than over an extended perimeter edge. Thus, the amount of physical contact between the lift member 40 and the disks is substantially reduced compared to the lift saddle 10. As a result, the lift member 40 is more suitable for sputtering or other processes which add material to the surface of each disk. Such processes can proceed in a less obstructed manner relative to the R-side of the disks.

The lift member includes a body 42 and three single-piece disk engaging members or blades 44. In some embodiments, the blades are permanently fixed to the lift member 40 and are not capable of adjustment. However, in embodiments, the blades are adjustably attached to the lift member by set screws 46 or other means to allow positioned adjustment of the blade relative to the body. The blade may include three apertures 48, 50, 52 for this purpose. The center aperture 50 may be enlarged to permit fine adjustment of the blade's position. This also permits the three blades to be properly aligned relative to each other to optimally secure the disks. The outer apertures 48, 52 may be secured to any of a series of securement holes in the lift body (not shown), whose relative positions are predetermined to accommodate disks of different diameters. The removeability permits replacement of the blades due to wear or for other reasons.

As shown in FIG. 13, the blades 44 have a disk engaging edge 54 that is generally W-shaped for engaging, holding and maintaining the desired gap merge orientation of the pair of disks. As shown in FIG. 14, the edge of the blade is designed with teeth 56, 58, 60 to permit cradling of each disk along the perimeter or outer edge of the disk. As should be appreciated, the profile of the blade can vary for different purposes, such as maintaining different spacing between the disks or accommodating different thickness of disks. Also, the profile of the blade edge may be designed to match or maintain spacing imparted to disk pairs by other equipment. For example, in the sputtering process, pairs of disks may be transferred from a cassette to a lift member 40 to other processing or transfer equipment and back through this chain of handling equipment to the cassette. In such a context, it would be preferable that the spacing of the disks be consistent to facilitate transfer among the various pieces of equipment. As a result, disks may be transferred without change of spacing or orientation of the disks.

In some embodiments primarily intended for sputtering, the angle A, shown in FIG. 13, is between approximately 100 and 110 degrees. A wide angle such as this intentionally avoids contact between the blade edge 44 and the data zone of the disks so that the sputtering process is not impeded on the R-side of each disk. With reference to FIG. 12, the outer blades 62 are disposed at an angle B relative to the vertical center line of the disk, which is defined by the center blade 64. In this embodiment, angle B is 55 degrees. The lift member and blades may be made from high temperature resistant material, such as 304 or 316 stainless steel (full hard), in order that it may withstand high temperature environments. When working with disks having a thickness of about 0.050 inches, the blade is preferably 0.250 inches wide and 0.015 inches thick.

Another apparatus for handling pairs of gap merge disks is shown in FIGS. 15-19. As illustrated therein, a cassette 70 is provided for transporting disks grouped in pairs. In the preferred embodiment, the cassette will accommodate 25 pairs of single-sided disks (50 total) in the same space as conventional cassettes carrying 25 double-sided disks. In other words, two disks having a 0.05 inch thickness, individually, can be positioned every 0.25 inches along the length of the cassette, rather than one double-sided disk.

In one application, the cassette is used as part of the sputtering process where the disks reach substantially elevated temperatures, up to 350 degrees Celsius. In this application, the cassette may be machined from a single block of aluminum or other heat-resistant metal to accommodate the high temperatures. Machining the cassette from a single block of metal also eliminates the need for multiple piece cassettes held together by fasteners or screws. The joints and apertures in such multi-piece cassettes can introduce contaminants into the sputtering process which requires a high degree of cleanliness (a level 10 clean room). As should be appreciated, contaminants can ruin an entire batch of disks. In some embodiments, the cassette will be plated to improve abrasion resistance between the disks and the cassette, thereby reducing potential particulate contamination on the disk surfaces. An appropriate plating material is nickel.

Referring to FIGS. 15 and 17, a series of marks or holes 72, precisely aligned, are machined along the top edge 74 of the side walls 76 of the cassette to allow positive positioning of the cassette relative to the processing machinery. Ideally, one alignment mark 72 is positioned adjacent each pair of gap merge disks. In FIG. 17, the marks are positioned adjacent the gap between the two disks comprising each pair of disks. Known optical and mechanical systems maybe used for positioning the cassette based on these alignment marks. They may also be used to index the position of the cassette relative to the processing equipment as successive pairs of disks are removed and returned, until the entire batch of disks has been processed. The alignment holes are machined to allow bi-directional alignment of the cassette relative to the processing equipment and other machinery.

A row of ribs 78 designed to accommodate and position the pairs of disks is disposed along the inside surface 80 of the side walls of the cassette. As best seen in FIG. 19, the row of ribs comprise a series of alternating large and small ribs 82, 84, respectively. The large ribs separate pairs of disks from adjacent pairs of disks, and the small ribs maintain separation of the two disks comprising each pair of disks. In some embodiments, assuming the thickness of the disks permits, a pair of disks is placed every 0.25 inches along the length of the cassette. The spacing between the two disks of each pair is created by the small rib 84 and is between approximately 0.025 and 0.035 inches when dealing with disks having a 0.050 inch thickness. A pair of channels, or grooves, 86 is formed between the ribs 82 by each rib 84. The channels 86 and ribs 82, 84 position pairs of disks in a gap merge orientation. The end walls 88 of the cassette also include a cutout or opening 90 to allow access to the central aperture formed in each disk.

As previously mentioned, one use for this metal cassette is in connection with the sputtering process, or any process where the disks reach high temperatures, such as approaching 300 degrees Celsius. In this high temperature environment, gap merge orientation of disks is almost a requirement. If pairs of disks are placed in contact merge orientation after reaching approximately 300 degrees Celsius, the aluminum substrate, or core, could literally melt.

Another cassette 100 for holding a plurality of pairs of disks in gap merge orientation is shown in FIGS. 20-30. The cassette is made from three modular pieces, eight pieces in total. Its modular nature allows for the replacement of worn pieces or interchangeability of differently configured pieces. Thus, as will be apparent to one skilled in the art, the cassette can be reconfigured to position disks in different orientations, such as gap merge or other configuration needed during disk processing. In addition, the length of the cassette can be changed to carry different numbers of disk pairs. In some embodiments, this cassette would be made from plastic and, therefore, have its use limited by the characteristics of the plastic employed to make the cassette.

Figure 29:
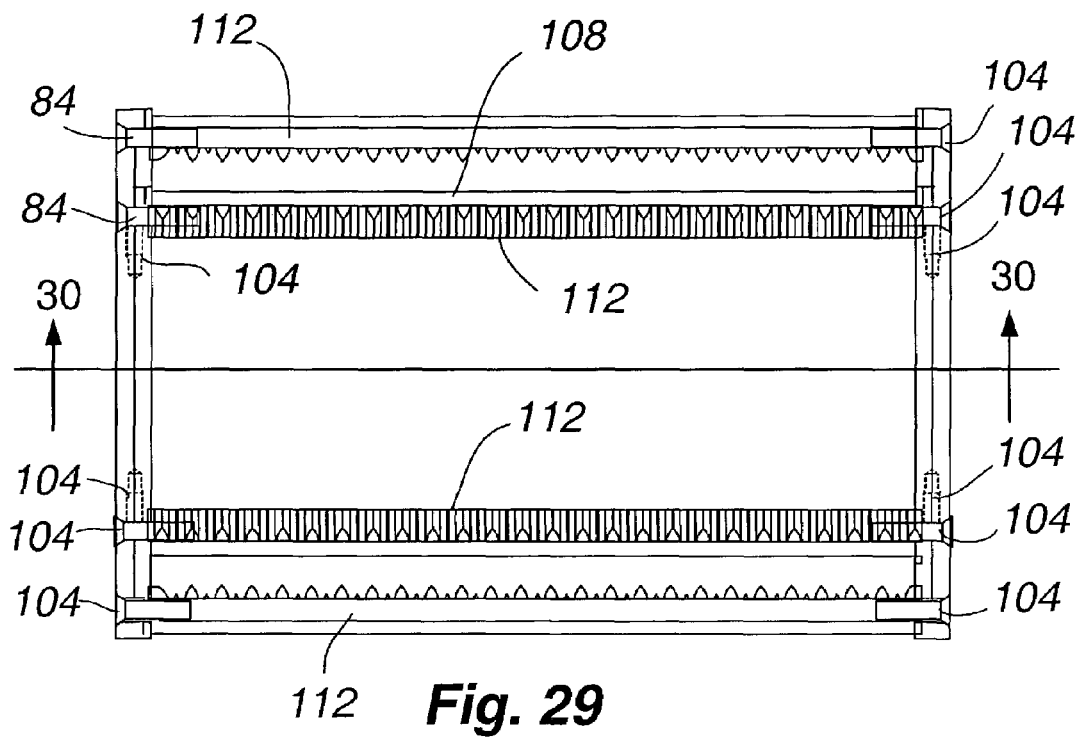
FIG. 29 is a top plan view of the embodiments in FIG. 28.
Figure 30:
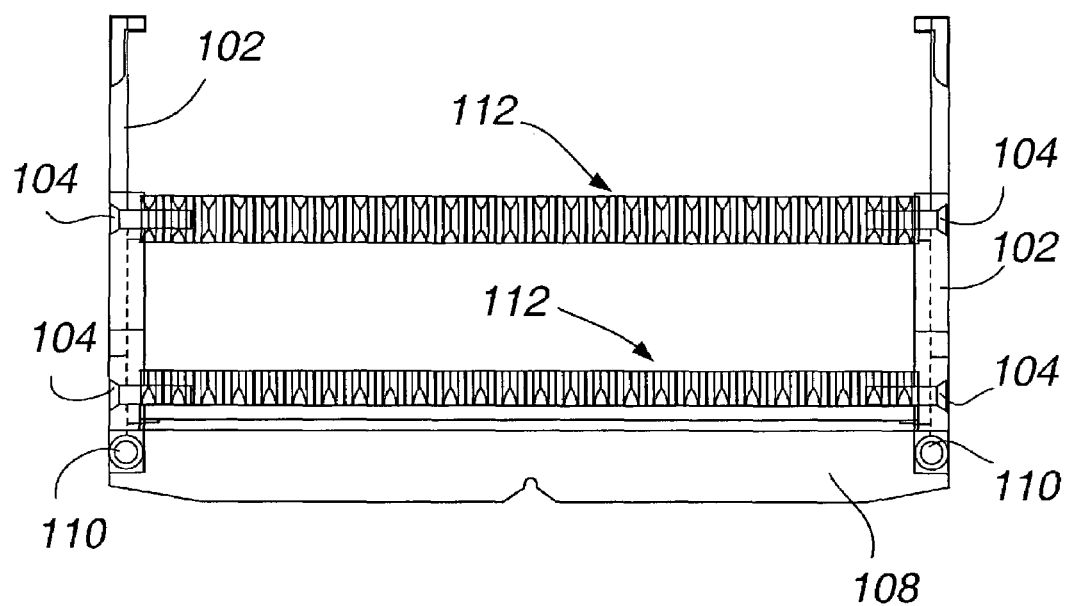
FIG. 30 is a cross-section taken along line 30-30 of FIG. 29.

The end walls 102 are generally U-shaped to allow access to the disks and include six apertures 104 for attachment of the other component pieces. The U-shaped opening 106 provides access to the disks. A pair of base wall members 108, shown in FIGS. 25, 26, are attached to the end walls through securement holes 110 in the base wall members and in the end walls. Screws or other fasteners are used to attach the base wall to the end walls. In addition, four side wall members 112 are attached between each end wall to provide disk support surfaces. All four side wall members shown in FIGS. 28-30 are identical to each other. A single side wall member is shown in FIGS. 22, 23.

The inside surface 114 of the side walls, shown in FIGS. 22 and 28-30, include a row of teeth, alternating between a large size 116 and a smaller size 118. In some embodiments, and as shown in FIG. 23, each side wall is octagonal in cross-section.

With reference to FIG. 24, an enlarged view of the profile of one gap merge disk support groove 120 is shown. A pair of large teeth 116 are separated by an interspaced smaller tooth 118. The side wall of the large teeth has two surfaces, a base portion 126 and an upper portion 128. The angle formed by the upper portion of the side walls of the adjacent large teeth is 60 degrees. The base portions of the side walls form a 90 degree angle. The angle of the base portion is designed to accommodate chamfers in the outer perimeter edges of the disks. Precision manufacture of these grooves allows maintaining consistent and accurate alignment of the disks, which is necessary for the precise handling required for single surface processing. It should be appreciated that the configuration of the teeth, or ribs, can be modified to accommodate different alignment, orientation or spacing among the disks. Thus, side walls 112 having disk support surfaces that accommodate other disk orientations may also be utilized. A gap merge orientation cassette is described in co-pending U.S. patent application Ser. No. 10/435,362 entitled "Cassette Apparatus for Holding 25 Pairs of Disks for Manufacturing Process", filed May 9, 2003, the entirety of which is incorporated herein by reference as if stated herein.

Merging of disks may be further facilitated by use of a merge nest. A merge nest works in association with a disk cassette and assists in merging pairs of disks into a desired orientation, such as gap merge orientation. An example of a merge nest is described in co-pending U.S. patent application Ser. No. 10/434,546 entitled "Automated Merge Nest for Pairs of Magnetic Storage Disks" (Publication No. U.S.-2004-0071535A1), filed May 9, 2003, the entirety of which is incorporated herein by reference as if fully stated herein.

It should be appreciated that the variations in the above-described embodiments may occur to those of skill in the art without departing from the spirit and scope of the claimed invention. For example, the cassette may be designed to hold any number of disk pairs. The disk support surfaces formed by the teeth in the side walls may be configured to support disks of different thickness and different spacing between disks. The cassette may be made of high-temperature metal, as well as any other material suitable for its intended purpose, depending upon the environment in which it will be placed. It is preferred that abrasion-resistant materials be used to reduce contamination to the disks during processing.

The foregoing discussion has been presented for purposes of illustration and description. The foregoing is not intended to limit the contemplated embodiments to the form or forms disclosed herein. In the foregoing Detailed Description for example, various features are grouped together in one or more embodiments for the purpose of streamlining the disclosure. This method of disclosure is not to be interpreted as reflecting an intention that the claimed invention requires more features than are expressly recited in each claim. Rather, as the following claims reflect, inventive aspects lie in less than all features of a single foregoing disclosed embodiment. Thus, the following claims are hereby incorporated into this Detailed Description, with each claim standing on its own as separate embodiments of the invention.

Moreover, though the description of the claimed invention has included description of one or more embodiments and certain variations and modifications, other variations and modifications are within the scope of the invention as claimed, e.g. as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A method for manufacturing hard memory disks, comprising:

positioning a cassette at a first location, the cassette containing a plurality of disks arranged in parallel axial alignment;

orienting a pair of adjacent disks in the cassette on a transfer tool such that the disks remain in parallel axial alignment with a space between them;

moving the pair of disks from a first location to a second location;

simultaneously processing the pair of disks.

2. The method of claim 1, further comprising maintaining of the pair of disks on the transfer tool while simultaneously processing the disks.

3. The method of claim 1, further comprising placing the disk pair in the cassette with transfer tool, following processing.

4. The method of claim 1, further comprising placing the plurality of disks in the cassette, prior to orienting the pair of disks on the transfer tool.

5. The method of claim 2, wherein said processing comprises subjecting the pair of disks to temperatures of at least approximately 350 degrees Celsius.

6. The method of claim 2, wherein said processing comprises adding material to the outwardly facing surface of each disk.

7. The method of claim 6, wherein said processing comprises sputtering.

8. The method of claim 6, wherein said processing comprises deposition.

9. A method of manufacturing single-sided hard memory disks, comprising:
positioning a carrier containing a plurality of disks in parallel axial alignment at a first location;
positioning two adjacent disks in the carrier on a transfer tool in the parallel axial alignment with a space between the disks;
removing the pair of disks from the carrier using the transfer tool;
simultaneously processing the pair of disks;
returning the pair of disks to the carrier.

10. The method of claim 9, further comprising maintaining the orientation of the disk pair on the transfer tool during processing.

11. The method of claim 9, further comprising removing the pair of disks from the transfer tool prior to processing.

12. The method of claim 9, further comprising changing the position of the carrier following the return of a pair of disks to the carrier.

13. The method of claim 9, further comprising repeating the steps of positioning, removing, processing and returning until all disks in the carrier have been processed.

14. The method of claim 13, further comprising:
positioning the carrier at a second location;
positioning two disks on a transfer tool in parallel axial alignment with a space between the disks;
removing the pair of disks from the carrier using a second transfer tool;
simultaneously processing the pair of disks;
returning the pair of disks to the carrier.

15. The method of claim 14, further comprising repeating the steps of positioning, removing, processing and returning at the second location until all disks in the carrier have been processed a second time.

16. The method of claim 15, wherein the first processing step differs from the second processing step.

17. The method of claim 9, wherein said carrier is made with aluminum.

18. The method of claim 9, wherein said carrier is made from material resistant to temperatures of at least 350 degrees Celsius.

19. The method of claim 9, wherein said carrier is a single piece of metal.

20. The method of claim 9, wherein said carrier is plated for abrasion resistance.

21. The method of claim 9, further comprising placing a plurality of disks in a carrier prior to positioning a carrier at a first location.

22. The method of claim 21, further comprising placing up to 50 disks in the carrier.

23. The method of claim 21, wherein said step of placing a plurality of disks in the carrier comprises orienting the disks in parallel axial alignment and in pairs with a space between the disks, and wherein the space between disks within a pair is no greater than the space between adjacent pairs of disks.

24. The method of claim 9, wherein positioning two disks on a transfer tool comprises engaging a length of the outer perimeter edge of each disk.

25. The method of claim 24, wherein engaging a length of the outer perimeter edge of each disk comprises placing the disks in parallel adjacent grooves formed in the transfer tool.

26. The method of claim 25, wherein placing the disks in parallel adjacent grooves further comprises locating a separating member between the disks.

27. The method of claim 24, wherein engaging a length of the outer perimeter edge of each disk comprises engaging an outer perimeter edge of the disks along the bottom of each disk.

28. The method of claim 9, wherein removing the pair of disks from the carrier comprises moving the transfer tool vertically between a position substantially beneath the carrier and a position such that the pair of disks are above the carrier.

29. The method of claim 9, further comprising transferring the pair of disks to a second transfer tool following removing the disks from the carrier using a transfer tool.

30. The method of claim 29, further comprising moving the second transfer tool to a second position following transferring the pair of disks to a second transfer tool.

31. The method of claim 9, wherein positioning two disks in a transfer tool comprises engaging each disk at three locations.

32. The method of claim 31, further comprising engaging the two disks at three locations spaced around the outer perimeter of the disks.

33. The method of claim 31, wherein the three locations are substantially evenly spaced apart.

34. The method of claim 9, wherein positioning two disks on a transfer tool does not block access to the outwardly facing surface of either disk.

35. The method of claim 31, further comprising maintaining the orientation of the disks on the transfer tool during movement of the transfer tool.

36. A method of manufacturing single-sided hard memory disks, comprising:
positioning a carrier at a first location in relation to an indicia defined by the carrier, the carrier containing a plurality of disks in parallel axial alignment;
positioning two disks in the carrier on a transfer tool in the parallel axial alignment with a space between the disks;
removing the pair of disks from the carrier using the transfer tool;
simultaneously processing the pair of disks;
returning the pair of disks to the carrier.

37. A method of manufacturing single-sided hard memory disks, comprising:
positioning a carrier containing a plurality of disks in parallel axial alignment at a first position;
positioning two disks in the carrier on a transfer tool in the parallel axial alignment with a space between the disks;
removing the pair of disks from the carrier using the transfer tool;
simultaneously processing the pair of disks;
returning the pair of disks to the carrier;
adjusting the position of the carrier in relation to an indicia defined by the carrier.

38. A method of manufacturing single-sided hard memory disks, comprising:

placing a plurality of discs in a carrier arranged in pairs, wherein a space between adjacent pairs of disks is greater than a space between disks forming a pair;

positioning the carrier containing the plurality of disks in parallel axial alignment at a first position;

positioning two disks in the carrier on a transfer tool in the parallel axial alignment with a space between the disks;

removing the pair of disks from the carrier using the transfer tool;

simultaneously processing the pair of disks;

returning the pair of disks to the carrier.

* * * * *

UNITED STATES PATENT AND TRADEMARK OFFICE
CERTIFICATE OF CORRECTION

PATENT NO. : 7,628,895 B2 Page 1 of 1
APPLICATION NO. : 10/435161
DATED : December 8, 2009
INVENTOR(S) : Buitron et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1308 days.

Signed and Sealed this

Second Day of November, 2010

David J. Kappos
*Director of the United States Patent and Trademark Office*